United States Patent
Kim et al.

(10) Patent No.: US 7,459,838 B2
(45) Date of Patent: Dec. 2, 2008

(54) PLASMA DISPLAY DEVICE, TCP APPLIED THERETO, AND METHOD OF MANUFACTURING THE TCP

(75) Inventors: Ki-Jung Kim, Suwon-si (KR); Eun-Gon Kim, Suwon-si (KR)

(73) Assignee: Samsung SDI Co., Ltd., Suwon (KR)

( * ) Notice: Subject to any disclaimer, the term of this patent is extended or adjusted under 35 U.S.C. 154(b) by 219 days.

(21) Appl. No.: 10/992,678

(22) Filed: Nov. 22, 2004

(65) Prior Publication Data
US 2005/0110936 A1    May 26, 2005

(30) Foreign Application Priority Data
Nov. 26, 2003 (KR) .............. 10-2003-0084505

(51) Int. Cl.
*H01L 23/06* (2006.01)
*H01J 17/49* (2006.01)
*H02B 1/00* (2006.01)

(52) U.S. Cl. .......... 313/231.31; 349/150; 313/582; 313/231.01; 313/231.41; 257/684; 257/678; 361/600; 361/673

(58) Field of Classification Search ........ 313/231.31; 349/150
See application file for complete search history.

(56) References Cited

U.S. PATENT DOCUMENTS

| | | | |
|---|---|---|---|
| 6,542,374 B1* | 4/2003 | Muramatsu et al. | 361/760 |
| 7,254,031 B2* | 8/2007 | Kim et al. | 313/46 |
| 2003/0020152 A1* | 1/2003 | Inoue et al. | 257/684 |
| 2003/0058230 A1* | 3/2003 | Ide | 345/204 |
| 2005/0088093 A1* | 4/2005 | Kim et al. | 313/582 |

FOREIGN PATENT DOCUMENTS

| | | |
|---|---|---|
| KR | 1020030017118 | 3/2003 |
| KR | 1020030031361 | 4/2003 |

* cited by examiner

*Primary Examiner*—Sikha Roy
*Assistant Examiner*—Natalie K Walford
(74) *Attorney, Agent, or Firm*—H.C. Park & Associates, PLC

(57) ABSTRACT

A plasma display device includes a plasma display panel, a chassis base coupled to the plasma display panel, a drive circuit coupled to the chassis base, a flexible printed circuit (FPC) couples the drive circuit to electrodes of the plasma display panel. An integrated circuit (IC) is mounted on a film structured in the form of a tape carrier package (TCP), and coupled to the FPC. An epoxy resin deposited in a connecting region where the driver IC is connected to wiring of the FPC is formed with an uneven area that includes indentations and protrusions formed substantially uniformly.

16 Claims, 3 Drawing Sheets

PLASMA DISPLAY DEVICE, TCP APPLIED THERETO, AND METHOD OF MANUFACTURING THE TCP

CROSS REFERENCE TO RELATED APPLICATION

This application claims priority to and the benefit of Korean Patent Application No. 10-2003-0084505, filed on Nov. 26, 2003, which is hereby incorporated by reference for all purposes as if fully set forth herein.

BACKGROUND OF THE INVENTION

1. Field of the Invention

The present invention relates to a plasma display device, and more particularly, to a plasma display device formed without an air gap in a connecting region of a tape carrier package (TCP) driver integrated circuit (IC). The present invention relates also to a method for manufacturing the TCP.

2. Discussion of the Background

Generally, a plasma display device displays images using plasma generated by a gas discharge. A flexible printed circuit (FPC) is typically used to couple display panel electrodes to a drive circuit. An IC may be formed on the FPC for selectively generating a wall voltage in pixels according to signals controlled in the drive circuit.

ICs formed on FPCs are widely used for applying voltages, and they may be formed on the FPC using a variety of known techniques, such as the chip on board (COB) and chip on film (COF) assembly methods. Tape carrier packages (TCPs) are becoming more popular because of the small sizes that may be achieved with them, as well as their low cost.

A TCP is a semiconductor chip packaging format utilizing tape automated bonding (TAB) tape. The TAB technology refers to the process of mounting and coupling a driver IC on the TAB tape's copper beam leads.

The TAB tape typically has circuit wiring patterned on a polyimide tape, and the beam leads are connected to the circuit wiring and exposed in a window region where the driver IC is positioned. A solder register layer protects the circuit wiring.

The TAB tape beam leads are coupled to a bump formed on a chip pad of the driver IC, thereby maintaining electrical and physical connections between the two. Further, an epoxy resin potting protects the driver IC from the external environment.

Thermal grease may be applied between the driver IC and a chassis base, or between the driver IC and a reinforcing member on the chassis base, so that heat may be quickly dissipated from the driver IC. A heat dissipating plate may also be mounted at an outer surface of the driver IC to emit heat to the outside.

However, the conventional TCP driver IC is not without problems. In particular, since an epoxy resin is deposited on a copper film of the FPC and a connecting section of the driver IC (i.e., a rear surface of the driver IC), once dried, a center area of the epoxy resin may have a depressed formation. This depressed formation may permit formation of a layer of air in the area when the depositing surface of the epoxy resin adheres to the chassis base or reinforcing member. This air gap reduces the driver IC's heat dissipating efficiency.

Furthermore, thermal grease is often applied to the deposition surface of the epoxy resin in order to reduce heat resistance caused by the air gap. In this case, the thermal grease may be forced outward from the epoxy resin when the driver IC is subsequently pressed onto the chassis base or reinforcing member. If the driver IC is removed and re-attached during assembly, the thermal grease may be depressed and therefore unable to fill the center area of the epoxy resin. Consequently, even when using the thermal grease, the epoxy resin's depressed formation and the layer of air may remain.

The air gap may permit excessive accumulation of heat generated by the TCP driver IC, thereby causing the TCP driver IC to breakdown and, in extreme cases, burst.

SUMMARY OF THE INVENTION

The present invention provides a driver IC with an improved capability to dissipate heat through an improved epoxy resin deposition structure.

The present invention also provides a TCP of a plasma display device that may prevent the formation of an air gap and insufficient filling of thermal grease during a device's attachment and re-attachment to a chassis base or reinforcing member.

Additional features of the invention will be set forth in the description which follows, and in part will be apparent from the description, or may be learned by practice of the invention.

The present invention discloses a plasma display device comprising a plasma display panel, a chassis base coupled to the plasma display panel, a drive circuit coupled to the chassis base, a flexible printed circuit (FPC) coupling the drive circuit and the plasma display panel, and an integrated circuit (IC) coupled to the FPC. An epoxy resin is deposited in a coupling region where the IC is coupled to the FPC, and the epoxy resin has a surface comprising an indentation and a protrusion.

The present invention also discloses a tape carrier package comprising a flexible printed circuit (FPC) having a beam lead extending into a window area of the FPC, an integrated circuit (IC) coupled to the beam lead, and an epoxy resin in the window area of the FPC to protect the IC and the beam lead. The indentations and protrusions are formed on an outer surface of the epoxy resin.

The present invention also discloses a method for manufacturing a tape carrier package having an integrated circuit (IC) mounted on a film that is bonded using a tape carrier process. The method includes connecting an inner beam lead formed on a flexible printed circuit and a bump of the IC by a process of thermo-compression bonding, depositing an epoxy resin in an area of connection between the beam lead and the IC, forming an uneven area comprising indentations and protrusions in an outer surface of the epoxy resin, and curing the epoxy resin.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION

An exemplary embodiment of the present invention will now be described in detail with reference to the drawings.

Figure 1:
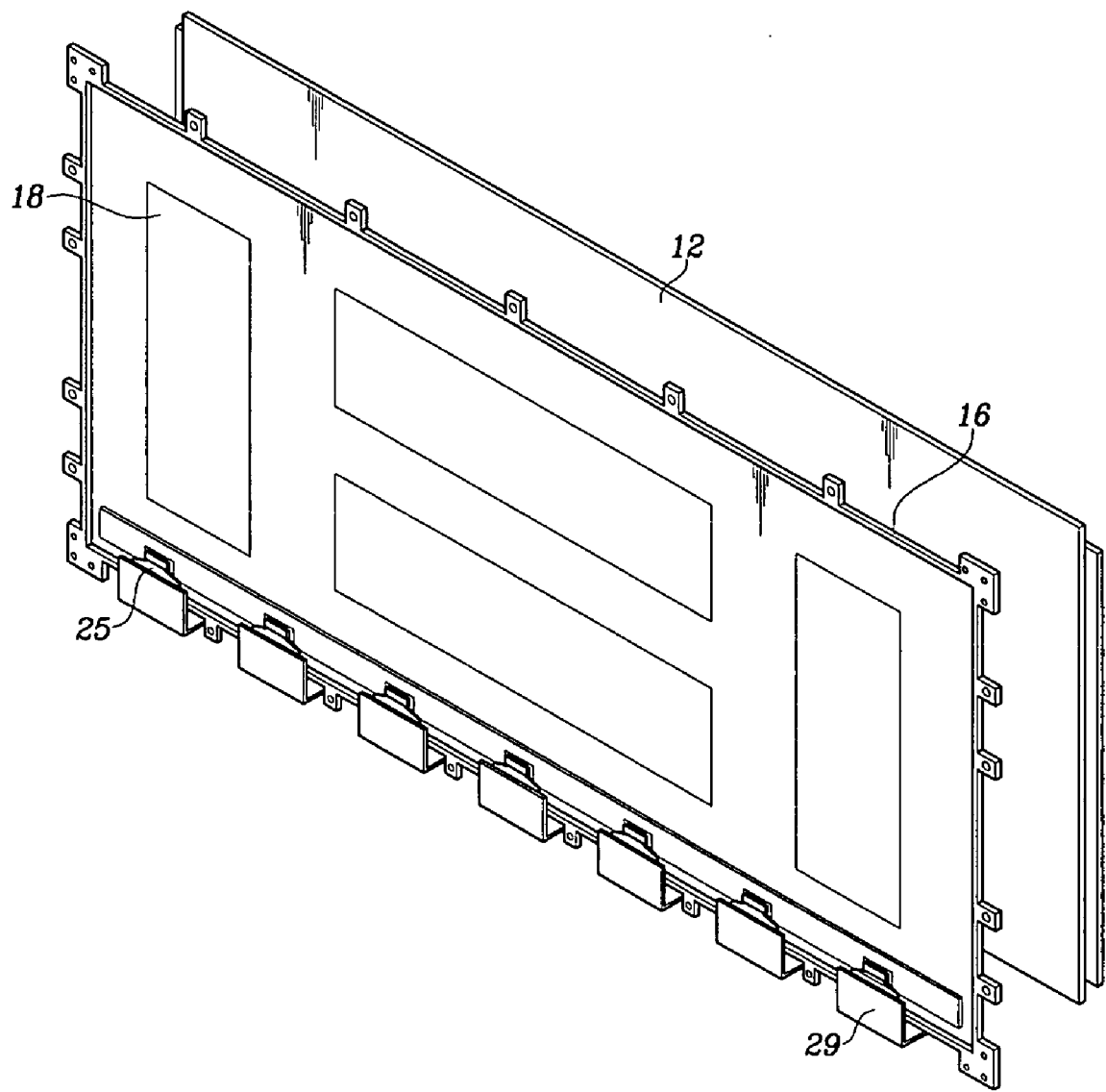
FIG. 1 is a perspective view of a plasma display device according to an exemplary embodiment of the present invention.
Figure 2:
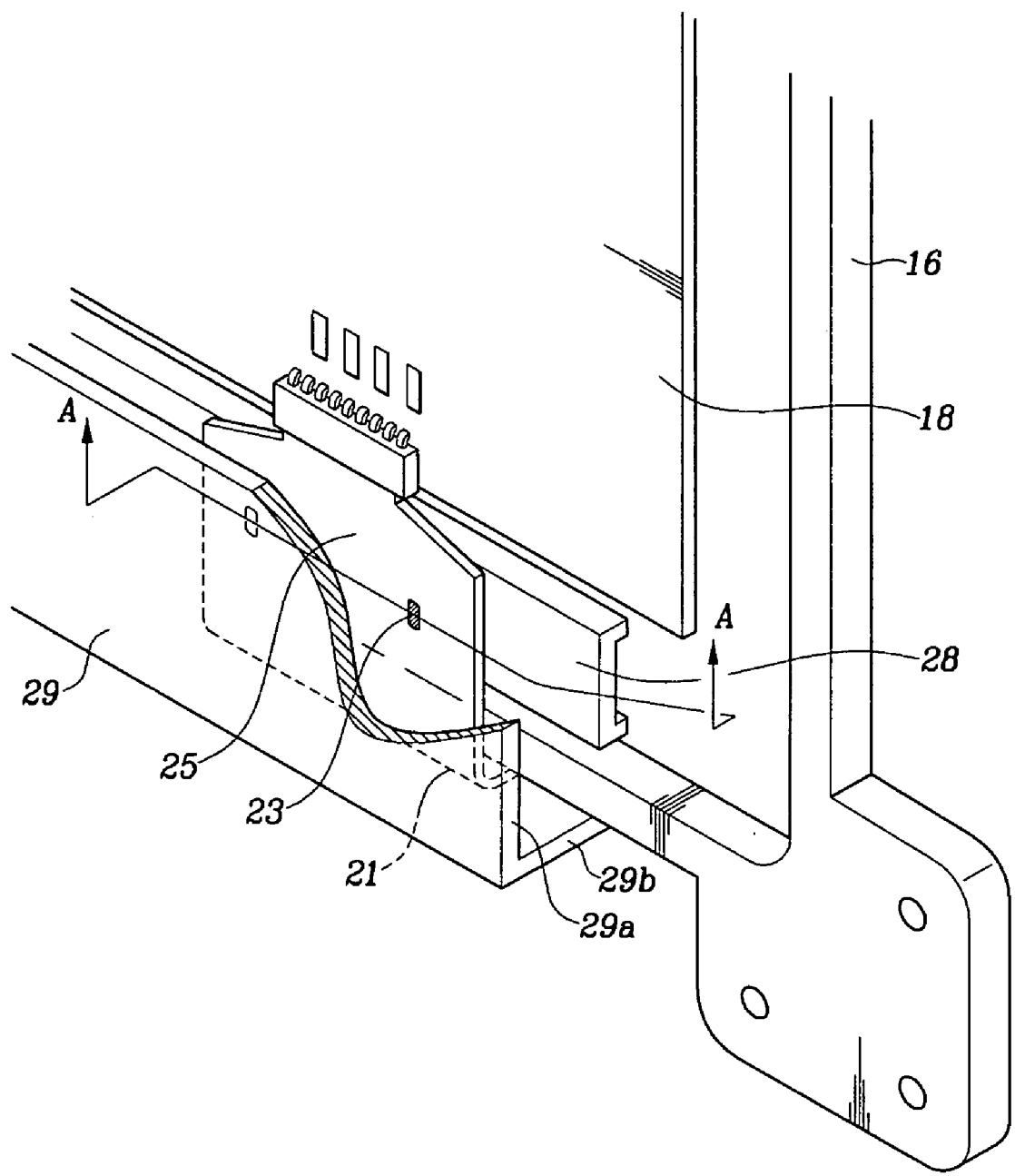
FIG. 2 is a partially exploded perspective view of the plasma display device of FIG. 1.
Figure 3:
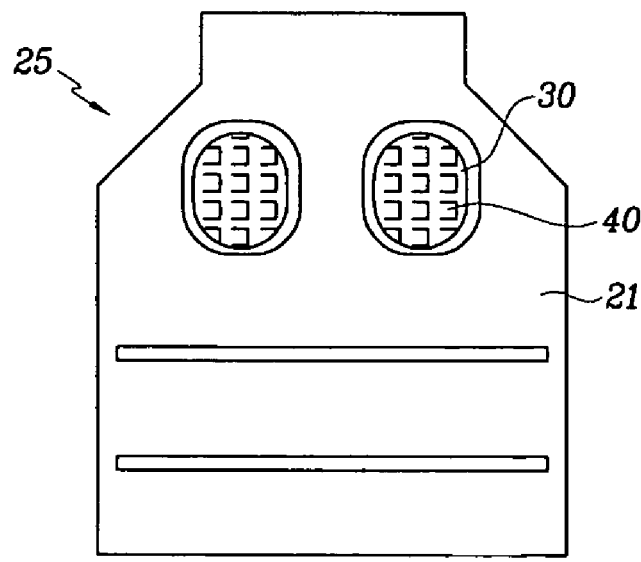
FIG. 3 is front view of a structure of an epoxy resin deposited on a driver IC of FIG. 2.
Figure 4:
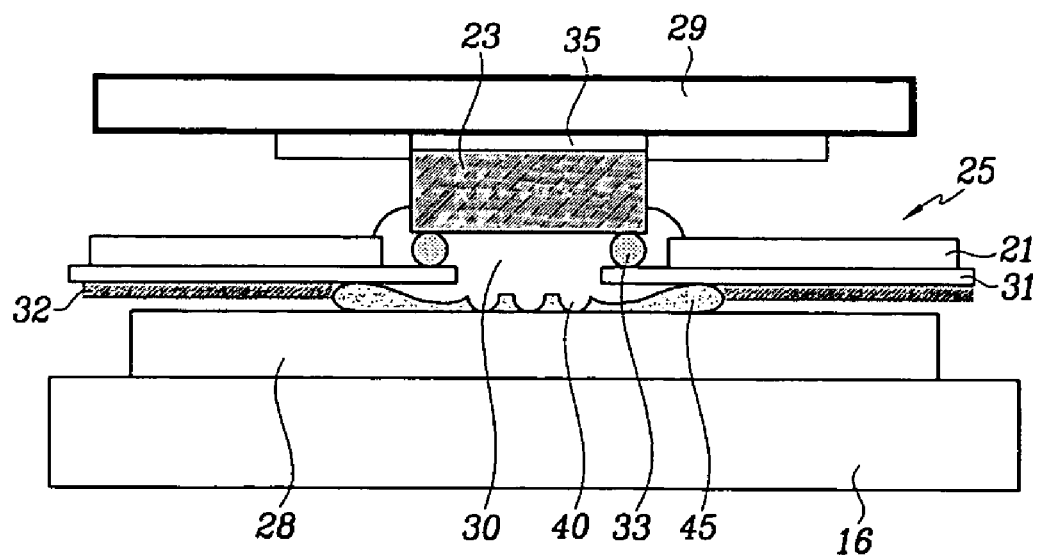
FIG. 4 is a sectional view taken along line A-A of FIG. 2.

FIG. 1 is a perspective view of a plasma display device according to an exemplary embodiment of the present invention, FIG. 2 is a partially exploded perspective view of the plasma display device of FIG. 1, FIG. 3 is front view of a structure of an epoxy resin deposited on a driver IC of FIG. 2, and FIG. 4 is a sectional view taken along line A-A of FIG. 2.

Referring to FIG. 1, FIG. 2, FIG. 3 and FIG. 4, a plasma display device according to an exemplary embodiment of the present invention includes a plasma display panel ("panel") 12 and a chassis base 16. The panel 12 and the chassis base 16 each have a substantially rectangular, planar shape with opposing inner and outer surfaces. The panel 12 is mounted substantially parallel to the chassis base 16 such that their inner surfaces are adjacent to one another. Drive circuits 18 may be mounted on an outer surface of the chassis base 16. A thermal conducting medium (not shown) may be interposed between the panel 12 and the chassis base 16. A front cover (not shown) is positioned at the outer surface of the panel 12, and a back cover (not shown) is positioned at the outer surface of the chassis base 16. The front cover is connected to the back cover to house the plasma display device.

Electrodes of the panel 12 may be coupled to the drive circuits 18 through FPCs 21 to thereby receive signals required for operation. Specifically, driver ICs 23 on the FPCs 21 may selectively apply voltages to the electrodes of the panel 12 according to signals controlled by the drive circuits 18. In an exemplary embodiment of the present invention, the driver ICs 23 may be packaged in TCPs 25 for coupling to the FPCs 21 and the drive circuits 18.

Further, the driver ICs 23 may be positioned on an optional reinforcing member 28, which may be mounted to the chassis base 16, and a heat dissipating plate 29 may cover the TCPs 25. The heat dissipating plate 29 may contact an outer surface of the driver IC 23 and press the driver IC 23 toward the reinforcing member 28. Additionally, the heat dissipating plate 29 dissipates heat generated by the driver IC 23. A thermal conductor 35 may be interposed between the heat dissipating plate 29 and the driver IC 23.

Each heat dissipating plate 29 includes a first surface 29a, which covers the driver ICs 23 and has upper and lower ends, and a second surface 29b, which extends from the lower end of the first surface 29a in a direction toward the panel 12 until reaching an outer surface thereof, thereby acting as a support for the FPCs 21. The heat dissipating plate 29 may be made of a conductive material such as aluminum, copper, or steel, and it is fixed to the chassis base 16 through connectors (not shown).

An epoxy resin 30 is deposited in a connecting region between the FPCs 21 and the driver ICs 23, and it covers a rear surface of each of the driver ICs 23. An outer surface of the epoxy resin 30 may contact the reinforcing member 28, and it may be formed with indentations and protrusions to thereby form an uneven region 40, as shown in FIG. 3 and FIG. 4. A depth of the indentations may be 0.1 mm or greater.

Each of the TCPs 25 may have a structure in which at least one of the driver ICs 23 is mounted on the corresponding FPC 21. An upper end of the TCPs 25 may be coupled to a corresponding drive circuit 18, and a lower end may be coupled to the panel 12. Further, the epoxy resin 30 may be deposited in the connecting region of the driver ICs 23, as described above, and the uneven region 40 may be formed having protrusions and indentations that are substantially uniformly distributed thereon.

The TCPs 25, the driver ICs 23, and the connecting structure between the TCPs 25 and the chassis base 16 will be described in greater detail with reference to FIG. 4. The connections associated with only one of the driver ICs 23 will be described in the following by way of example to illustrate such connections for all of the driver ICs 23.

In the TCP 25, a beam lead 31 is formed in a circuit pattern, and a solder register layer 32 protects the FPC 21. The beam lead 31 extends into a window area defined by the FPC 21, and a bump 33 is interposed between the beam lead 31 and the driver IC 23. The epoxy resin 30 is deposited and cured in the window area, and it protects the extended portion of the beam lead 31 and the driver IC 23. The uneven region 40 may be formed on an outer surface of the epoxy resin 30.

The uneven region 40 may contact the reinforcing member 28, which may be optionally mounted on the chassis base 16, and a thermal grease 45 may be applied between the contacting surfaces of the uneven region 40 and the reinforcing member 28. The heat dissipating plate 29 may be positioned to cover a side of the driver IC 23 away from the epoxy resin 30. As noted above, a thermal conductor 35 may be interposed between the heat dissipating plate 29 and the driver IC 23.

Manufacturing the TCP 25 will now be described. First, a copper film is attached to a thick polyimide film (75 μm or greater) to produce an FPC with a desired circuit pattern. Next, a bump of a driver IC is thermally compressed onto a portion of a beam lead extending into a window area of the FPC. An epoxy resin is deposited in the window area to cover the extended portion of the beam lead and an adjacent area of the driver IC. An uneven region is formed on a surface of the epoxy resin away from the driver IC before the epoxy resin is fully cured. The uneven region may be formed such that protrusions and indentations are uniformly present on the surface of the epoxy resin. The epoxy resin is then cured.

Following curing, an electrical test, and marking and printing processes, may be performed. Since these subsequent processes are well known to those skilled in the art, a detailed description thereof will not be provided herein.

The uneven region 40 of the epoxy resin 30 may provide specific benefits. Namely, when the driver IC 23 is pressed toward the reinforcing member 28, the thermal grease 45 deposited between the reinforcing member 28 and the epoxy resin 30, as described above, may be forced into the indentations of the uneven region 40, and the amount of the thermal grease 45 forced outward and away from the area of the epoxy resin 30 may be minimized. This may prevent the formation of an air gap between the reinforcing member 28 and the epoxy resin 30.

Further, when re-installing the driver IC 23 after removing it, the thermal grease 45 in the indentations of the uneven area 40 may remain therein. Therefore, an air gap may also be prevented from forming between the epoxy resin 30 and the reinforcing member 28 when the driver IC 23 is re-attached.

It will be apparent to those skilled in the art that various modifications and Is variation can be made in the present invention without departing from the spirit or scope of the invention. Thus, it is intended that the present invention cover the modifications and variations of this invention provided they come within the scope of the appended claims and their equivalents.

What is claimed is:

1. A plasma display device, comprising:
   a plasma display panel;
   a chassis base coupled to the plasma display panel;
   a drive circuit coupled to the chassis base;
   a flexible printed circuit (FPC) coupling the drive circuit and the plasma display panel;

an integrated circuit (IC) coupled to the FPC; and an epoxy resin deposited in a coupling region where the IC is coupled to the FPC, wherein the epoxy resin has a surface comprising an indentation and a protrusion, and wherein the indentation and the protrusion do not contact the IC or the FPC.

2. The plasma display device of claim 1, wherein the surface comprising an indentation and a protrusion has indentations and protrusions formed substantially uniformly.

3. The plasma display device of claim 2, wherein the indentations are at least 0.1 mm deep.

4. The plasma display device of claim 2, wherein the surface comprising the indentations and the protrusions is a surface of the epoxy resin facing towards the chassis base.

5. The plasma display device of claim 4, further comprising:

a reinforcing member coupled to the chassis base, wherein the surface comprising the indentations and the protrusions is adjacent to the reinforcing member.

6. The plasma display device of claim 5, wherein the protrusions contact the reinforcing member.

7. The plasma display device of claim 5, wherein thermal grease is applied between the reinforcing member and the surface comprising the indentations and the protrusions.

8. A tape carrier package, comprising:

a flexible printed circuit (FPC) having a beam lead extending into a window area of the FPC;

an integrated circuit (IC) coupled to the beam lead; and an epoxy resin in the window area of the FPC to protect the IC and the beam lead, wherein indentations and protrusions are formed on an outer surface of the epoxy resin, and wherein the indentations and the protrusions do not contact the IC or the FPC.

9. The tape carrier package of claim 8, wherein the indentations are formed at least 0.1 mm deep.

10. A plasma display device, comprising:

a plasma display panel;

a chassis base coupled to the plasma display panel;

a drive circuit coupled to the chassis base;

a flexible printed circuit (FPC) coupling the drive circuit and the plasma display panel;

an integrated circuit (IC) coupled to the FPC; and an epoxy resin deposited in a coupling region where the IC is coupled to the FPC, the epoxy resin comprising a first side and a second side, the second side comprising a plurality of indentations and protrusions, wherein first side contacts the IC, and the indentations and the protrusions do not contact either the IC or the FPC.

11. The plasma display device of claim 10, wherein the indentations and the protrusions are formed substantially uniformly.

12. The plasma display device of claim 11, wherein the indentations are at least 0.1 mm deep.

13. The plasma display device of claim 11, wherein the second side faces towards the chassis base.

14. The plasma display device of claim 13, further comprising:

a reinforcing member coupled to the chassis base, wherein the second side is adjacent to the reinforcing member.

15. The plasma display device of claim 14, wherein the protrusions contact the reinforcing member.

16. The plasma display device of claim 14, wherein thermal grease is disposed between the reinforcing member and the second side.

* * * * *